United States Patent [19]
Pellin et al.

[11] Patent Number: 6,137,110
[45] Date of Patent: Oct. 24, 2000

[54] FOCUSED ION BEAM SOURCE METHOD AND APPARATUS

[75] Inventors: Michael J. Pellin, Naperville, Ill.; Keith R. Lykke, Gaithersburg, Md.; Thorsten B. Lill, Sunnyvale, Calif.

[73] Assignee: The United States of America as represented by the United States Department of Energy, Washington, D.C.

[21] Appl. No.: 09/134,928

[22] Filed: Aug. 17, 1998

[51] Int. Cl.[7] .................................................. H01J 27/00
[52] U.S. Cl. ...................................... 250/423 P; 250/309
[58] Field of Search .............................. 250/309, 492.21, 250/423 P

[56] References Cited

U.S. PATENT DOCUMENTS

| | | |
|---|---|---|
| 4,549,082 | 10/1985 | McMillan . |
| 4,629,898 | 12/1986 | Orloff et al. . |
| 4,639,301 | 1/1987 | Doherty et al. . |
| 5,015,862 | 5/1991 | Holmes et al. ........................ 250/423 P |
| 5,019,705 | 5/1991 | Compton . |
| 5,126,165 | 6/1992 | Akihama et al. .................... 250/492.21 |
| 5,148,027 | 9/1992 | Umemura et al. ....................... 250/309 |
| 5,196,707 | 3/1993 | Gesley . |
| 5,209,944 | 5/1993 | Opower et al. . |
| 5,272,338 | 12/1993 | Winograd et al. .................... 250/423 P |
| 5,290,761 | 3/1994 | Keating et al. . |
| 5,350,920 | 9/1994 | Fukuyama et al. ..................... 250/309 |
| 5,432,670 | 7/1995 | Batchelder et al. . |
| 5,567,935 | 10/1996 | Fajardo et al. . |
| 5,798,529 | 8/1998 | Wagner .............................. 250/492.21 |

*Primary Examiner*—Bruce C. Anderson
*Attorney, Agent, or Firm*—Bradley W. Smith; Mark P. Dvorscak; William R. Moser

[57] ABSTRACT

A focused ion beam having a cross section of submicron diameter, a high ion current, and a narrow energy range is generated from a target comprised of particle source material by laser ablation. The method involves directing a laser beam having a cross section of critical diameter onto the target, producing a cloud of laser ablated particles having unique characteristics, and extracting and focusing a charged particle beam from the laser ablated cloud. The method is especially suited for producing focused ion beams for semiconductor device analysis and modification.

24 Claims, 1 Drawing Sheet

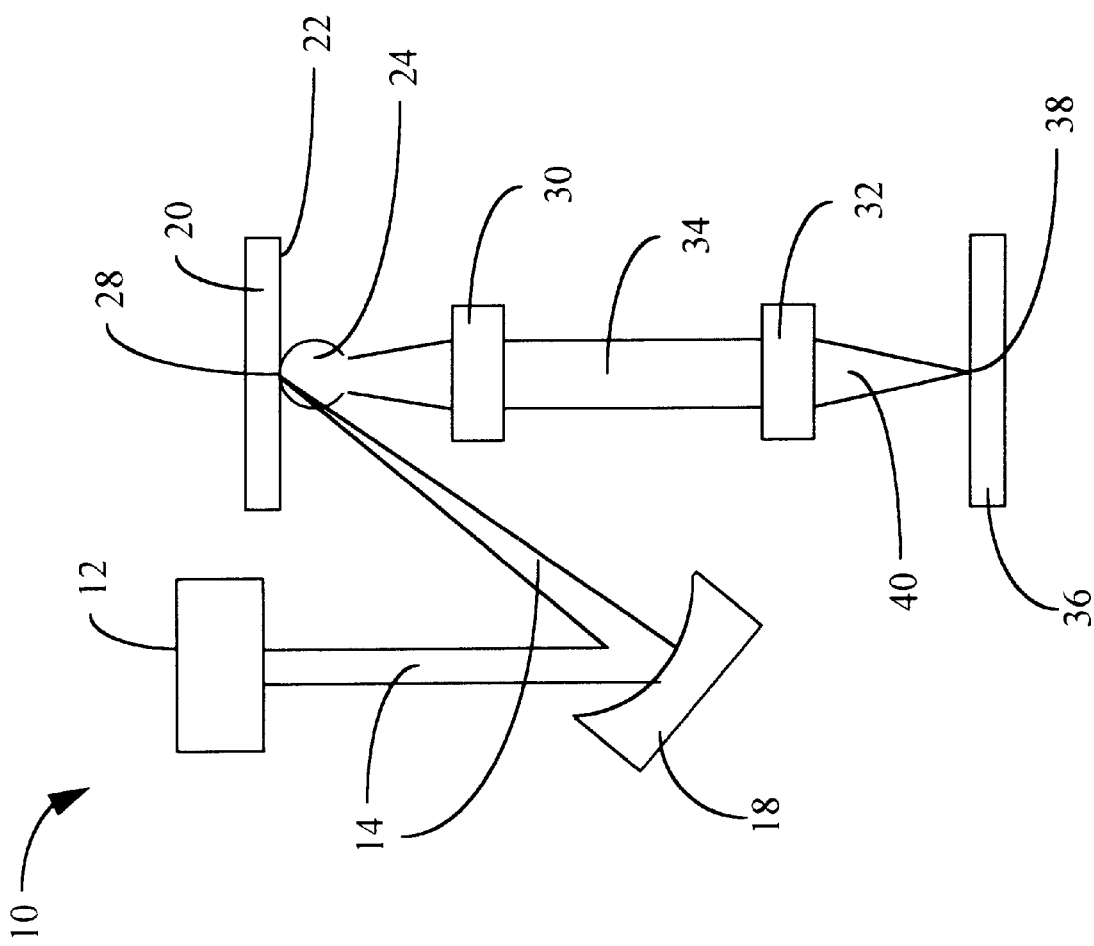

FOCUSED ION BEAM SOURCE METHOD AND APPARATUS

CONTRACTUAL ORIGIN OF THE INVENTION

The United States Government has rights in this invention pursuant to Contract Number W-31-109-ENG-38 between the United States Government and Argonne National Laboratory represented by the University of Chicago.

TECHNICAL FIELD

The present invention relates to focused ion beam (FIB) sources and, more particularly, to the use of laser energy to generate high current pulsed ion beams having submicron resolution.

BACKGROUND OF INVENTION

Focused ion beam (FIB) sources generally extract ions from an ion source and accelerate and focus the extracted ions into an ion beam. The focused ion beam is useful for performing surface and structural analysis or modification, such as precision cutting and material deposition. FIB sources are of increasing and critical importance to the semiconductor industry, as FIB sources significantly reduce the time and costs concomitant with integrated circuit design, development, fabrication, evaluation, and repair.

The critical parameters of FIB sources include the diameter of the ion beam or spot size, the ion current density, and the energy range or spread of the beam. Obviously, focused ion beams are employed where a small spot size is desirable. The ion current density is the brightness of the focused beam and is measured in amps/cm$^2$. The energy range of the ion beam is described by $\Delta E/E$, where $\Delta E$ is the energy spread of the ion beam and E is the extraction energy of the ion beam source. An ion beam having a narrow energy range (low $\Delta E$) is more easily focused into a small spot size than an ion beam having a large energy range. Additional considerations are the average energy of the ion beam, the available target materials for producing the ions comprising the beam, the ability to generate a pulsed ion beam, as opposed to a continuous wave (CW), and the ability to produce particles in addition to ions, for example, molecules, atoms, or ion clusters within the beam.

For applications in the semiconductor industry, it is desirable to have a FIB source capable of producing an ion beam having a submicron spot size, a high current density, and a narrow energy range. A submicron spot size is advantageous due to the diminutive complex structures of the microelectronic devices, e.g., integrated circuits (ICs). An ion beam having a high current density is desirable for better sputtering, imaging, and cutting in surface analysis and modification applications. A variety of target materials may be used to generate the ions, and there is new interest in the desirability of the presence of molecules, atoms, or ion clusters within the beam to allow sputtering of larger surface species for surface analysis and modification. A pulsed ion beam having a high rate of repetition would be particularly advantageous for surface analysis applications, since instruments used for detecting sputtered or back scattered ions require a pulsed ion source, for example, Secondary Ion Mass Spectrometers (SIMS). An adjustable average energy range allows the spot size of the ion beam to be changed to desired dimensions.

Available FIB sources include liquid metal gun ion sources (LMIGSs) and gas field ionization sources. LMIGSs produce ion beams by applying a strong electric field to the end of a needle or capillary of liquid metal, typically either pure metals with low melting points (e.g., Ga, Li) or eutectic alloys (e.g., AuSi, CoNd, CoGe), which results in the liquid forming a sharp tip (Taylor cone) where ion emission occurs. U.S. Pat. No. 4,639,301 issued to Doherty, et al. describes a submicron focused ion beam using a LMIGS. Although LMIGSs produce high current ion beams (about 10 amps/cm$^2$) with submicron resolution, the ion beams have large energy ranges or spreads which cause chromatic aberration of the ion beam, limiting minimization of the spot size. LMIGSs are also generally limited as a continuous wave (CW) ion beam source, however, "pulsed" ion beams may be generated with some amount of difficulty using an aperture and a scanning technique.

Gas phase field ionization emitters produce ion beams from a volume of gas, such as argon, krypton, oxygen, or nitrogen, rather than from a liquid metal needle. Ions are produced from gas molecules, by known methods including photo-ionization, and that traditional extraction optics are used to form the ion beam. Since the source of the ion beam is a volume, as opposed to a plane or small surface area, the brightness or current density of the extracted ion beam is low (about 0.1 amps/cm$^2$). Although gas phase ionization sources have medium energy spreads (less than LMIGSs), they are not capable of providing focused high current beams having the narrow energy ranges required by many of the semiconductor applications. The average spot size for gas phase field ionization sources is as small as about 1 micron.

Most FIB systems use computer control to guide the ion beam, whether in a raster pattern (scanning from side to side in lines from top to bottom) or in a vector pattern (scanning over a selected area of a substrate). Also, lens optics and deflecting plates are used to control chromatic aberration and spherical aberrations of the beam. Chromatic aberration is an increase in the beam size due to the velocity dispersion of the beam. In other words, the beam must be nearly monoenergetic, wherein the ions have the substantially the same energy, for the focusing lens to effectively focus the beam into a subnucron spot size. Therefore, the chromatic aberration is a function of the ion beam's energy spread ($\Delta E/E$), and a narrow energy spread is most beneficial for generating an ion beam with a submicron spot size. Spherical aberrations are an increase in the beam size due to a variation in the beam particles' focal length from the central axis of the beam. If the ion beam begins from a source having a large surface area or volume, then producing a small spot size is more difficult than producing a small spot size from a beam originating from a small surface area or small volume. In other words, an ion source that creates ions in a very small volume has very high brilliance (large concentration of ions per unit volume). Chromatic aberrations are more limiting to final beam size than spherical aberrations.

Advantages of using FIB sources are a computer controlled beam, no mask requirement, submicron spot size, minimization of diffraction effects, less back scattering, higher resolution, and very accurate detection of surface features. Disadvantages include the need for a reliable high current ion source having a narrow energy spread, rather than the very large energy spreads of the currently available high current focused ion beams.

The present invention provides a reliable FIB source for generating a pulsed ion beam having a high current density, narrow energy spread, and submicron spot size by using laser energy. Surprisingly, an ion beam produced by specific control of laser ablation has a narrow energy spread and a small angular distribution (the initial trajectory of the sputtered ions are substantially along an axis perpendicular to the surface of the target material). The focused ion beam is intrinsically pulsed by employing laser technology, and the pulsed nature of the ion beam has significant advantages in surface analyses applications over continuous wave FIB sources. The average energy of the generated ion beam is also adjustable over a wide range. The present FIB source advantageously produces a variety of primary beam charged particles, including molecular ions and ion clusters, and the ion source material may be any solid or liquid matter vaporized by laser energy. The present FIB source is intrinsically pulsed and requires no cross beam electric fields, eliminating tailing difficulties associated with pulsed sources. The design of the present FIB source is very simple and economical, especially since powerful and inexpensive lasers are readily available.

Therefore, in view of the above, a basic object of the present invention is to provide a method and apparatus for producing an ion beam having a high peak current and narrow energy spread on a target area in the submicron range by using laser radiation.

A further object of this invention is to produced the high current ion beam in a pulsed manner.

Another object of the present invention is to produce an ion beam capable of generating a variety of particles for analysis, including atomic ions, molecular ions, and ion clusters.

Yet another object of the invention is to use a variety of solid or liquid materials to produce the primary ion beam, including, but not limited to: Al, Au, Ga, Si, $C_{60}$, Cs, C, B, and P, and alloys thereof.

Yet another object of the invention is to produce an ion beam having an ion current that is adjustable over a wide energy range.

Additional objects, advantages, and novel features of the present invention will become apparent from the description which follows and/or will become apparent to those skilled in the art upon examination of the following or may be learned by practice of the invention. The objects and advantages of the invention may be realized and attained by means of instrumentation and combinations particularly pointed out in the appended claims.

BRIEF SUMMARY OF THE INVENTION

This invention provides a method and apparatus for generating a high current pulsed ion beam having a narrow energy spread and submicron resolution using laser radiation. The pulsed FIB is generated by directing a laser to a surface comprised of a target material and vaporizing the target material to produce an ion beam. The laser is focused in an area with a diameter of less than about 1 micrometer, which allows for the generation of an ion beam having a spot size of less than 1 micrometer, when directed to a sample substrate with extraction and focusing optics. The target material may be any solid or liquid material ablatable by laser energy, and the primary ion beam may be composed of a variety of charged species, including molecular ions and ion clusters.

BRIEF DESCRIPTION OF THE DRAWINGS

The appended claims set forth those novel features which characterize the invention. The features and advantages of the present invention will be apparent to those of ordinary skill in the art in view of the detailed description of the preferred embodiment, which is made with reference to the drawings, in which:

FIG. 1 shows a schematic diagram of the focused ion beam apparatus.

DETAILED DESCRIPTION OF THE INVENTION

Focused ion beam (FIB) sources generate a precise and highly controlled ion beam having a submicron diameter or spot size on the surface of a substrate. Characteristics which determine the desirability of FIB sources for certain applications are spot size, ion current density, and the energy spread of the beam, among others. Submicron spot size is critical in most FIB applications. In addition, it is most advantageous for the submicron diameter beam to have a high ion current density, or brightness, and narrow energy spread.

The present FIB source generates a pulsed ion beam with submicron resolution and a high current density and narrow energy range by using laser radiation. The ion beam is produced by laser ablation of any evaporable target material, and, preferably, target material comprised of atoms and molecules with low ionization potentials. By means of mass separation techniques, the primary beam may advantageously be comprised of a variety of charged species, such as charged molecules and/or ion clusters, in addition to the elemental species generated by known FIB sources. In addition, the ion current is easily adjustable by changing the desorption laser power density.

FIG. 1 shows a schematic illustration of the FIB source 10. The laser source 12 emits a beam of laser radiation 14 in a pulsed manner. While any suitable laser source may be used, a laser 12 generating laser light 14 having about 10 kHz power is preferred, with the intensity or irradiance of the laser source depending upon the type of ion source material selected. Lasers having shorter wavelengths, such as yttrium-aluminum garnet (YAG) lasers with a 1.06 $\mu$m wavelength (harmonics of 532 $\mu$m, 355 $\mu$m, and 266 $\mu$m), are more easily focused and, therefore, preferable to lasers generating light of longer wavelengths, such as $CO_2$ lasers (infrared wavelength of 10.6 $\mu$m). Most preferable is the diode YAG laser. The minimum spot size of the generated focused ion beam is limited to the wavelength $\lambda$ of the laser source.

Currently, continuous wave (CW) laser sources are not available, however, for surface analysis applications, a pulsed ion beam source is a critical advantage. Many mass spectrometry instruments require that the sputtered and back scattered particles are generated by a pulsed ion source. For example, Secondary Ion Mass Spectrometry (SIMS) and Secondary Neutral Mass Spectrometry (SNMS) techniques require a short pulse length. In addition, lasers have a high repetition rate, e.g. the laser radiation may be pulsed on the order of 10 nanoseconds, or 5 kHz/second, and lasers having even higher repetition rates are under development. Pulsed ion beams generated by laser ablation have the potential for repetition rates approaching the utility of CW ion beams, in applications where a CW source is preferred. In other words, the pulse width of the ion beam is only limited by the repetition rate of the laser technology.

In this manner, laser light 14 is emitted in short pulses of high average current, where such duration and current are determined by an operator (not shown) and/or computer control having suitable software connected to the laser source 12. The pulsed beam of laser light 14 is directed to a target 20 having a surface 22 comprised of ion source material. The laser light 14 may be focused or directed to the target 20 by any known means, including by means of a lens or, as shown, a concave mirror 18. The incidence of laser light 14 on the target surface 22 comprised of the ion source material results in intense heat sufficient to vaporize a fraction of the ion source material into a cloud of ions 24, referred to as a laser ablated plume of ions.

Importantly, the diameter of the laser light 14 striking the surface 22 of the target 20 at the point of incidence 28 is less than 2 micrometers, and preferably less than 1 micrometer. The diameter of the incident laser beam is critical to the submicron resolution of the generated ion beam, since extraction and refocusing of the generated ion beam are required.

In the preferred embodiment, two optical systems 30, 32 are successively disposed along an axis substantially perpendicular to the surface 22 of the target 20:

an ion extraction system 30 for extracting ions from the laser ablated plume 24 to produce an extracted ion beam 34 and an ion focusing system 32 for focusing the extracted ion beam 34 to a desired beam diameter. More specifically, the ion extraction system 30 is grounded and an electric field is produced by applying a negative voltage (about 5 kV) to the target 20, whereby positive ions are extracted through an aperture (not shown) in the extraction system. Negative ions are similarly extractable by applying a positive voltage. Next, the ion focusing system 32 focuses the extracted ion beam 34 onto a sample substrate 36 (the work piece, e.g., integrated circuit), such that the spot size of the focused ion beam 40 at the point of incidence 38 on the sample substrate surface is less than one micrometer. The focusing system 32 is comprised of lenses known to those skilled in the art.

The target material or ion source material is not limited to a liquid metal source, but may be any liquid or solid material evaporable by laser radiation. No gas is required to be present within the vacuum chamber (not shown) housing the FIB source. Obviously, in semiconductor surface analysis or surface modification applications, heavier ions within the produced focused ion beam will remove more material from analyzed/modified surface than lighter ions.

The ion current is easily adjusted by changing the desorption laser power density. Lowering the desorption laser power density decreases the ion current, while raising the desorption laser power increases the ion current. The ability to adjust the ion current over a wide range enables depth profile measurements and probing of microelectronic structures.

By using the laser FIB source, an ion beam with a submicron spot size is generated in the appropriate extraction zone having a peak ion current of about $10^8$ ions/pulse/20 nanoseconds (measured at the apex of the pulse) and a narrow energy spread. The generated ion beam cannot be focused to a spot size less than the wavelength of the laser light source, and the ability to focus the ion beam is limited by the state of the art of the extraction and focusing optics. Ideally, the generated focused ion beam diameter is as small as 100 nanometers. Using currently available extraction and focusing optics, a submicron spot size of 0.10 microns is achievable. The average energy of the ion beam is determined by the extraction optics and ranges from between about 20 eV to about 50 keV. The generated ion beam has a small angular distribution, such that the initial trajectory of the sputtered ions are substantially along an axis perpendicular to the surface of the target material, an angular distribution smaller than that of an ion beam produced by a LMIGS and much smaller than an ion beam produced by gas phase ionization. The ion current is adjustable over a wide range from about 100 amp/cm² to about 500 amp/cm². The ion source is comprised of any liquid or solid material that is ablated by laser radiation, e.g., Al, Au, Ga, In, Li, $C_{60}$, AuSi, CoNd, CoGe, etc. Advantageously, the source material may be changed very rapidly. Preferably, the beam energy is less than about 10 eV.

The laser radiation ion source is a significant improvement over existing liquid metal ion and gas field ionization sources, because the present method and apparatus minimizes both chromatic aberration and spherical aberration of the ion beam, allowing small ion spots with high current density. The energy spread of the laser generated ion beam is narrow, such that the primary beam particles have substantially the same energy (within about ±0.2 eV), mitigating chromatic aberration. Since the diameter of the laser beam incident on the target surface is very small (less than 2 microns and preferably less than 1 micron), spherical aberration of the ion beam is also extenuated. As recognized by those skilled in the art, an advantage of the laser ion source is that the diameter of the ion beam (spot size) is therefore only significantly limited by space charge effects.

Although the parameters of the laser apparatus are determined to maximize production of ions, so that the beam may be extracted using extraction optics based on electrical potential, the present FIB source may be used to produce charged species, molecular ions and cluster ions, by means of mass separation of the primary beam. For example, the laser intensity may be increased to generate atoms, molecules, and ion clusters (e.g., $C_{60}$). The use of larger particles allows more efficient collision mechanisms, such that larger species may be removed from the sample surface, such as polymers. In-line measuring devices (not shown) may be used to measure characteristics of the ion beam.

The design of the FIB source is very simple and economical, as inexpensive lasers within the required power range are commercially available. Maintenance of the laser components of the ion generation device is advantageously conducted outside of the vacuum enclosure.

The foregoing description of a preferred embodiment of the invention has been presented for purposes of illustration and description. It is not intended to be exhaustive or to limit the invention to the precise form disclosed, and obviously many modifications and variations are possible in light of the above teaching. The embodiments described explain the principles of the invention and practical applications and should enable others skilled in the art to utilize the invention in various embodiments and with various modifications as are suited to the particular use contemplated. While the invention has been described with reference to details of the illustrated embodiment, these details are not intended to limit the scope of the invention, rather the scope of the invention is to be defined by the claims appended hereto.

The embodiments of the invention in which an exclusive property or privilege is claimed are defined as follows:

1. A focused ion beam source for generating a beam of charged particles having a desired ion current and a cross section of submicron diameter, and wherein the charged particles comprising the beam have energies within a desired energy range, comprising:

a target having a surface comprised of ion source material evaporable by laser energy;

a laser source for generating a beam of laser energy;

a point of incidence on said target surface, where the cross section of the laser beam at said point of incidence has a diameter of less than 2 microns and where the laser beam strikes said target surface producing a laser ablated cloud comprising charged particles;

means for extracting a beam of charged particles from the laser ablated cloud, whereby the charged particle beam has the desired ion current and the desired energy range; and means for focusing the extracted beam of charged particles, whereby the focused charged particle beam has a cross section of submicron diameter at a focal point.

2. The focused ion beam source according to claim 1, wherein the cross section of the laser beam at said point of incidence has a diameter of less than about 1 micron.

3. The focused ion beam source according to claim 1, wherein the cross section of the focused charged particle beam has a diameter of 0.10 microns.

4. The focused ion beam source according to claim 1, wherein the desired ion current is about $10^8$ particles per 20 nanoseconds.

5. The focused ion beam source according to claim 1, wherein said laser source generates a pulse of laser energy, whereby a plurality of pulses comprise the laser beam.

6. The focused ion beam source according to claim 6, wherein the desired ion current is about $10^8$ particles per pulse of laser energy per 20 nanoseconds.

7. The focused ion beam source according to claim 1, wherein the charged particles within the charged particle beam have energies within a range of ±1 eV.

8. The focused ion beam source according to claim 1, wherein the average energy of the charged particles within the charged particle beam is between about 20 eV to about 50 keV.

9. The focused ion beam source according to claim 1, wherein the extraction means is comprised of a grounded extraction apparatus having an aperture, whereby an electric field is produced by applying a voltage to said target, such that charged particles from the laser ablated cloud are extracted through the aperture to form an extracted charged particle beam.

10. The focused ion beam source according to claim 1, wherein the focusing means is a series of lenses.

11. The focused ion beam source according to claim 1, wherein the charged particles of the extracted charged particle beam are comprised of molecular ions.

12. The focused ion beam source according to claim 1, wherein the charged particles of the extracted charged particle beam are comprised of clusters of ions.

13. The focused ion beam source according to claim 1, wherein the charged particles are positively charged.

14. The focused ion beam source according to claim 1, wherein the charged particles are negatively charged.

15. The focused ion beam source according to claim 1, wherein the laser beam is directed to the point of incidence by a concave mirror.

16. The focused ion beam source according to claim 1, further comprising a vacuum chamber for housing the focused ion beam source.

17. A method for generating a focused ion beam having a desired ion current, a cross section of submicron diameter, and constituent charged particles with energies within a desired energy range, comprising the steps of:

generating a beam of laser radiation;

directing the laser beam to a target having a surface comprised of particle source material evaporable by laser radiation;

contacting the surface of the target with the laser beam having a cross sectional diameter of less than about 2 microns at the point of contact with the surface, such that a cloud of ablated source material comprising charged particles is formed;

extracting charged particles from the laser ablated cloud to form a charged particle beam; and focusing the charged particle beam, whereby a cross section of the focused charged particle beam has a submicron diameter at a focal point.

18. The method according to claim 17, wherein the step of contacting the target surface with the laser beam comprises contacting the target surface with a laser beam having a cross section with a diameter of less than about 1 micron at the point of contact.

19. The method according to claim 17, wherein the step of focusing the charged particle beam comprising focusing the charged particle beam to a cross section having a diameter of 0.10 microns at the focal point.

20. The method according to claim 17, wherein the step extracting charged particles to form a charged particle beam comprises forming a charged particle beam having an ion current of about $10^8$ particles per 20 nanoseconds.

21. The method according to claim 17, wherein the step of generating a beam of laser radiation includes generating pulses of laser radiation, whereby a plurality of pulses comprise the generated laser beam.

22. The focused ion beam source according to claim 21, wherein the step of generating a pulsed beam of laser radiation includes generating a pulsed beam of laser radiation having an ion current of about $10^8$ particles per pulse of laser energy per 20 nanoseconds.

23. The focused ion beam source according to claim 17, wherein the step of extracting charged particles to form a charged particle beam comprises forming a charged particle beam having charged particles with energies within a range of ±1 eV.

24. The focused ion beam source according to claim 17, wherein the step of extracting charged particles to form a charged particle beam comprises forming a charged particle beam having charged particles with an average energy of between about 20 eV to about 50 keV.

* * * * *